United States Patent [19]
Sumi

[11] Patent Number: 5,915,204
[45] Date of Patent: *Jun. 22, 1999

[54] METHOD OF MANUFACTURING A SEMICONDUCTOR DEVICE INCLUDING A METAL SILICIDE LAYER

[75] Inventor: Hirofumi Sumi, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/621,976

[22] Filed: Mar. 26, 1996

[30] Foreign Application Priority Data

Mar. 28, 1995 [JP] Japan ................................. P07-069015

[51] Int. Cl.$^6$ ........................ H01L 21/28; H01L 21/3065
[52] U.S. Cl. ........................ 438/683; 438/714; 438/723; 438/906; 438/974
[58] Field of Search ........................... 437/200; 438/630, 438/649, 651, 655, 677, 682, 683, 710, 714, 723, 798, 906, 974; 204/192.12, 298.06; 118/723

[56] References Cited

U.S. PATENT DOCUMENTS

| | | | |
|---|---|---|---|
| 4,585,668 | 4/1986 | Asmussen et al. | 427/38 |
| 4,721,553 | 1/1988 | Saito et al. | 204/192.12 |
| 5,043,300 | 8/1991 | Nulman | 438/664 |
| 5,122,251 | 6/1992 | Campbell et al. | 204/298.06 |
| 5,236,868 | 8/1993 | Nulman | 438/655 |
| 5,487,785 | 1/1996 | Horiike et al. | 118/723 E |
| 5,627,105 | 5/1997 | Delfino et al. | 438/627 |
| 5,726,097 | 3/1998 | Yanagida | 438/622 |

FOREIGN PATENT DOCUMENTS

2 214 708   9/1989   United Kingdom ................... 438/360

*Primary Examiner*—T. N. Quach
*Attorney, Agent, or Firm*—Hill & Simpson

[57] ABSTRACT

A method of manufacturing a semiconductor device comprises a step of forming a transition metal layer at least on an impurity diffusion layer of a semiconductor substrate, a step of forming a transition metal silicide in a self-aligned manner on the impurity diffusion layer by applying a heat treatment and a step of removing the transition metal layer other than that on the impurity diffusion layer, wherein the native oxide film on the impurity diffusion layer is removed by a plasma etching device capable of obtaining plasmas at a density of not less than $1\times10^{11}/cm^3$ and not more than $1\times10^{14}/cm^3$ prior to the step of forming the transition metal layer and the transition metal layer is formed successively. The native oxide film on the impurity diffusion layer can be removed uniformly, without causing damages such as crystal defects or surface roughness, so that the transition metal silicide layer can be formed as a low resistance flat layer with no grain agglomeration on a shallow impurity diffusion layer.

8 Claims, 8 Drawing Sheets

METHOD OF MANUFACTURING A SEMICONDUCTOR DEVICE INCLUDING A METAL SILICIDE LAYER

BACKGROUND OF THE INVENTION

1. Field of the Invention

The present invention relates to a method of manufacturing a semiconductor device and more specifically to a method of manufacturing a semiconductor device improved in a step of forming a transition metal silicide layer in self-aligned manner on an impurity diffusion layer of a semiconductor substrate.

2. Description of Related Art

Along with the development for the integration degree and the performance of semiconductor devices such as LSIs, the lateral width of a gate electrode has been reduced to less than quarter micron in MIS transistors. In such a fine device structure, it is essential to decrease the depth of an impurity diffusion layer at the same time with the reduction of the lateral width of the gate electrode for decreasing the short channel effect and ensuring the source-drain withstand voltage. As an example, in a MIS transistor having 0.25 μm lateral width of the gate electrode, it has been demanded to shallow the depth of the impurity diffusion layer to less than about 0.08 μm (80 nm).

As the depth of the impurity diffusion layer is made shallower, a sheet resistance value in a source-drain region increases to result in a problem of lowering a response speed and an operation limit frequency of the semiconductor device. This is because the operation limit frequency of the MIS transistor is in an inverse proportion with a gate delay time. This phenomenon gives a significant problem, particularly, in a microprocessor requiring high speed operation.

As a countermeasure, a salicide self aligned silicide process of forming a transition metal silicide layer of low resistivity on a source-drain region has been proposed. The outline of this process is to be explained below with reference to FIG. 7 and FIG. 8.

Figure 7A:
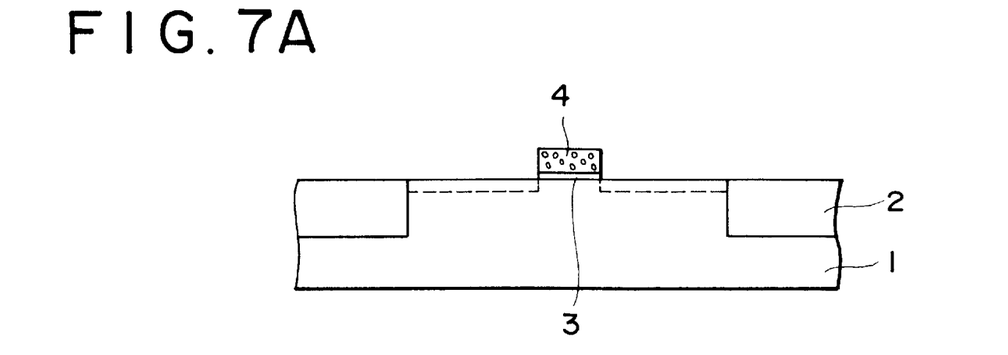
FIG. 7A shows a state of forming a device isolation region, a gate oxide film and a gate electrode to a semiconductor substrate and ion implanting impurities shallowly.

FIG. 7 and FIG. 8 are schematic cross sectional views illustrating a production process of MOSIC using an existent salicide process. At first, as shown in FIG. 7A, a device isolation region 2 is formed on a semiconductor substrate 1 made of silicon. After forming a thermal oxidation film and forming a polycrystal silicon layer patterning is applied to form a gate oxide film 3 and a gate electrode 4 and, further, impurities are injected shallowly by ion implantation.

Figure 7B:
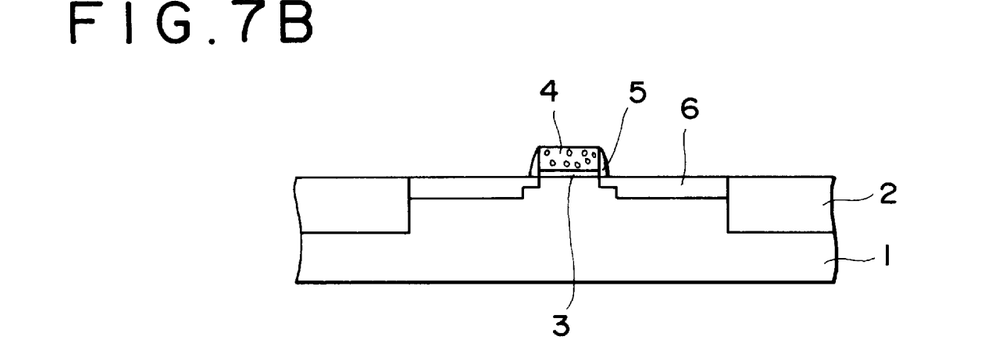
FIG. 7B shows a state of forming an impurity diffusion layer by an activating heat treatment after forming side wall spacers and FIG. 7C shows a state of forming a transition metal layer over the entire surface.
Figure 8A:
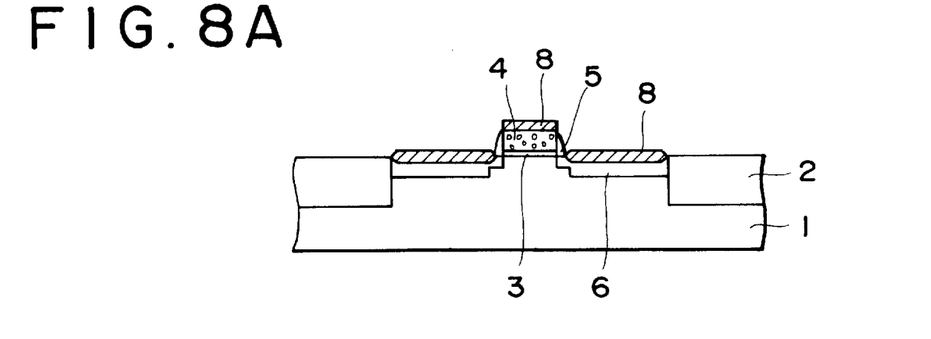
FIG. 8A shows a state of selectively forming a transition metal silicide layer on an impurity diffusion layer by a heat treatment.

Then, as shown in FIG. 7B, after forming a thick silicon oxide layer over the entire surface it is etched back to form side wall spacers 5 on the lateral sides of the gate electrode 4. Subsequently, impurities are again ion implanted and an activating heat treatment is applied to form an impurity diffusion layer 6 of an LDD structure.

Figure 7C:
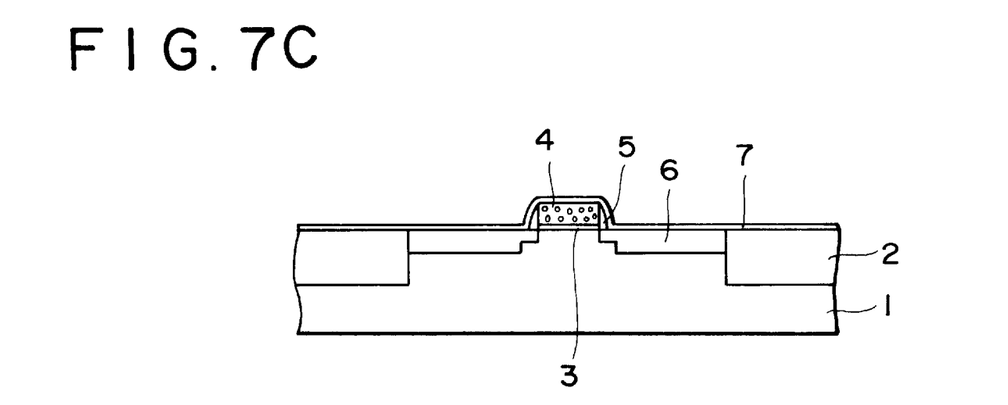

Then as shown in FIG. 7C, a transition metal layer 7 such as made of Ti is formed over the entire surface and the transition metal layer 7 on the impurity diffusion layer 6 is selectively converted into $TiSi_x$ through solid phase diffusion by applying a first heat treatment at about 600° C. Under the first heat treatment condition, the transition metal layer 7 does not react with the silicon oxide material. If the transition metal layer 7 is formed with the surface of the polycrystal Si gate electrode 4 being exposed, $TiSi_x$ is formed also on the gate electrode 4. However, if a spacer such as made of silicon oxide is formed on the gate electrode 4, $TiSi_x$ is not formed on the gate electrode 4.

Then, unreacted transition metal layer 7 is removed by wet etching with aqueous ammonia-hydrogen peroxide (mixed aqueous solution of $NH_3$ and $H_2O_2$) to leave $TiSi_x$ on the impurity diffusion layer 6. Subsequently, $TiSi_x$ of the impurity diffusion layer 6 is converted into $TiSi_2$ by a second heat treatment at about 800° C., to form a transition metal silicide layer 8. This shown in FIG. 8A. In the figure, the transition metal silicide 8 is formed also on the gate electrode 4.

Figure 8B:
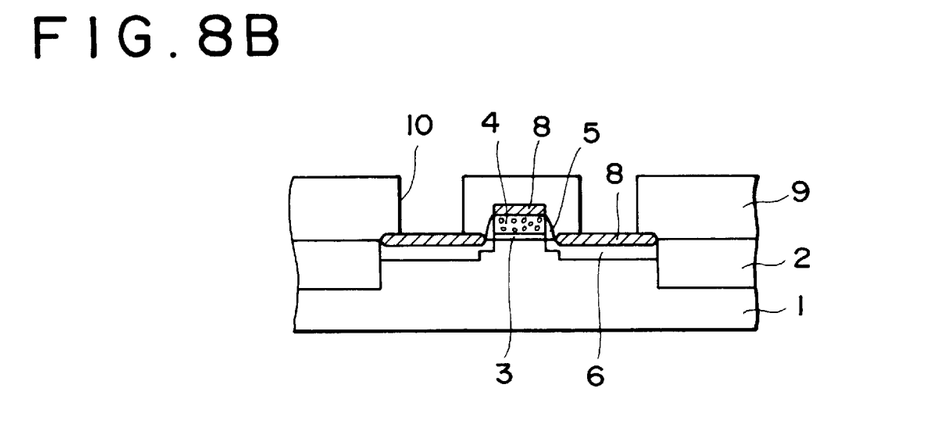
FIG. 8B shows a state of further forming an interlayer insulation film and forming a connection hole facing a silicide layer on the impurity diffusion layer and FIG. 8C shows a state of forming a barrier metal layer and an Al layer.
Figure 8C:
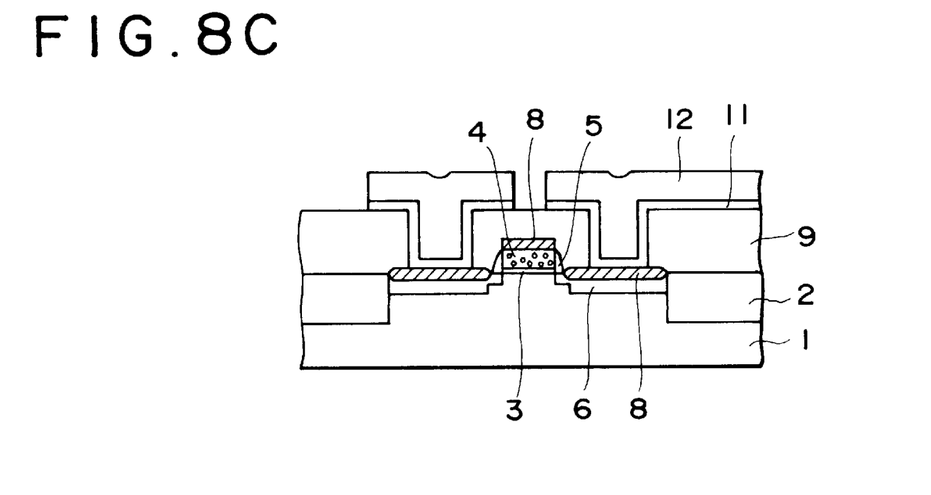

A main portion of the salicide process is as described above. Subsequently, an interlayer insulation film 9 is formed and a connection hole 10 facing the impurity diffusion layer 6 is opened by a customary method. Then, a Ti/TiON/Ti laminate structure layer and an Al type metal layer are formed and patterned to form an adhesion layer/barrier metal layer 11 and an Al layer 12, to complete MOSIC.

The MOSIC using the salicide structure has an advantage of lowering the source/drain resistance by about one digit compared with similar type of existent MOSIC. However, along with the recent trend of reducing the size of devices, the exposed surface area for the impurity diffusion layer 6 has also been made finer. If the salicide process is applied to such a narrow region of the impurity diffusion layer, crystal grains of the transition metal silicide are agglomerated to roughen surface and, as a result, lowering of the sheet resistance of the transition metal silicide layer can not be attained.

Further, it is also necessary to decrease the film thickness of the transition metal silicide layer corresponding to the decreasing depth of the impurity diffusion layer. The decreased thickness of the transition metal silicide layer also tends to cause agglomeration of the crystal grains. Accordingly, when a thin transition metal silicide layer is formed on a narrow region of the impurity diffusion layer, it is demanded for the development of a salicide process capable of preventing the crystal grains from agglomeration and attaining a smooth surface stably.

It is considered that one of the causes for the agglomeration of crystal grains in the transition metal silicide layer is attributable to a not uniform native oxide film present inevitably on the surface of the impurity diffusion layer. Among transition metal silicides, titanium silicide having the lowest resistance (resistivity: 15 $\mu\Omega$·cm) and used most frequently includes two types of crystal structures, namely, C49 crystal structure as a low temperature stable phase and C54 crystal structure as a high temperature stable phase. The C54 crystal structure is low resistance and stable $TiSi_2$. The C49 crystal structure causes phase transformation into the C54 crystal structure by a heat treatment at about 900° C., in which it is recrystallized accompanying grain boundary diffusion. Volumic shrinkage occurs in this stage and agglomeration of the crystal grains is observed. If the not uniform native oxide film remains on the impurity diffusion layer, agglomeration is promoted to result in roughening on the surface of the transition metal silicide.

As a pretreatment for forming the transition metal layer, light etching with a dilute aqueous HF solution is usually applied. However, it has been reported that complete removal of the native oxide film in a fine opening by the wet treatment is extremely difficult, for example, in the Pretext of 21th Super LSI Ultra Clean Technology Symposium; p156 (1994).

Further, even if the native oxide film is completely removed by the wet treatment, a not uniform native oxide film is formed again in the step of the subsequent drying treatment. As described above, when the transition metal layer is formed and subjected to the heat treatment with no sufficient cleaning for the surface of the impurity diffusion layer, siliciding reaction proceeds not uniformly. It is considered that the silicides tend to recrystallizate for stabilization in the succeeding second heat treatment to cause agglomeration.

As a pretreatment in place of the wet treatment for removing the native oxide film, it has been reported a method of the cleaning the surface of the impurity diffusion layer by an inverse sputtering in a Ti sputtering device or the like, for example, in IEEE Transactions on Electron Device 38-1, p88 (1991). In this method, inverse sputtering is applied by using Ar gas in a parallel plate sputtering device capable of generating plasmas at a density in the order of $1 \times 10^{10}/cm^3$ by combined use of magnetic fields. Since the transition metal layer can be formed immediately after the cleaning for the surface of the impurity diffusion layer by this in-situ cleaning, there is no worry for the agglomeration of the transition metal silicide.

However, for completely removing the native oxide film by the parallel plate type device, it is necessary to apply an acceleration voltage of higher than 1 KV to $Ar_+$. Accordingly, the surface of the impurity diffusion layer is roughened by the incident $Ar_+$ ion energy or crystal defect or like other damage is caused to make the progress of the subsequent siliciding reaction not uniformly thereby bring about a problem of increasing stresses in the silicide layer and causing peeling. Further, since extended portions of gate electrode-wirings are exposed to ion incidence at a high acceleration voltage upon sputter etching, the thin gate oxide film suffers from plasma damages.

SUMMARY OF THE INVENTION

An object of the present invention is to overcome the foregoing various problems in the existent salicide process. That is, an object of the present invention is to provide a method of manufacturing a semiconductor device, upon cleaning the surface of an impurity diffusion layer or the like on which a transition metal silicide layer is to be formed, capable of completely removing a native oxide film on the surface, and capable of obtaining a clean and smooth surface without roughening the surface of a shallow impurity diffusion layer and without suffering from crystal defects.

Another object of the present invention is to form a transition metal silicide layer of low resistivity having a smooth surface with no of agglomeration of crystal grains of a transition metal silicide layer to be formed, thereby contributing to high speed operation, low working voltage and low power consumption of semiconductor devices such as MOSICs based on fine design rules.

The present invention provides a method of manufacturing a semiconductor device for dissolving the foregoing problems and comprising a step of forming a transition metal silicide layer at least on an impurity diffusion layer of a semiconductor substrate, a step of forming a transition metal silicide layer in a self-aligned manner on the impurity diffusion layer by applying a heat treatment and a step of removing the transition metal layer other than that on the impurity diffusion layer, wherein the native oxide film on the impurity diffusion layer is removed by a plasma etching device capable of obtaining plasmas at a density not less than $1 \times 10^{11}/cm^3$ and not more than $1 \times 10^{14}/cm^3$ before the step of forming the transition metal layer, and then the transition metal layer is formed successively. As an example of a plasma etching device capable of obtaining such high density plasmas, there can be mentioned, for example, a substrate bias application type ECR (Electron Cyclotron Resonance) plasma etching device, an ICP (Inductively Coupled Plasma) etching device, a TCP (Transformer Coupled Plasma) etching device or a helicon wave plasma etching device. The plasma etching devices described above have advantages capable of applying high speed etching since they can generate plasmas at a high density not less than $1 \times 10^{11}/cm^3$ and not more than $1 \times 10^{14}/cm^3$, and capable of optionally selecting incident ion energy since the substrate bias can be controlled independently. Technical explanations for each of the plasma etching devices described above are detailed in each of technical reports and not recited here, but general descriptions can found in Monthly Semiconductor World Journal (published from Press Journal Co.), October, p 74–102 (1992).

By the way, the plasma density is at the order of $1 \times 10^9/cm^3$ in the parallel plate plasma etching device employed generally and at the order of $1 \times 10^{10}/cm^3$ order even in the magnetron RIE device using magnetic fields in combination, which is not somewhat satisfactory in view of the plasma density and the etching rate. On the other hand, the upper limit of the plasma density also has a close relation with an etching gas pressure. In the high density plasma etching device used in the present invention, the plasma density at $1 \times 10^{14}/cm^3$ under a gas pressure about at the order of $10^{-1}$ Pa as the main working pressure is a value approximate to complete dissociation.

Alternatively in the present invention, after the removal of the native oxide film on the impurity diffusion layer, the surface of the impurity diffusion layer may be made amorphous and then the transition metal layer may be formed successively. As an amorphous forming means, while ion implantation may be adopted, plasma etching at a higher plasma density may be applied for a short period of time. This method enables to form an extremely thin amorphous state on the outermost surface of the impurity diffusion layer.

The present invention further provides a method of manufacturing the semiconductor device comprising a step of forming a transition metal layer at least on an impurity diffusion layer of a semiconductor substrate, a step of forming a transition metal silicide layer in a self-aligned manner on the impurity diffusion layer by applying a heat treatment and a step of removing the transition metal layer other than that on the impurity diffusion layer, wherein the native oxide film on the impurity diffusion layer is removed by a plasma etching device capable of oblique ion incidence relative to the surface of the semiconductor substrate before the step of forming the transition metal layer and then the transition metal layer is formed successively. For the oblique ion incidence method, a substrate stage and a plasma generation source may be disposed obliquely to each other. In this case, uniformness of the plasma etching is improved by rotating either one of the substrate stage or the plasma generation source. In this case, a conventional parallel plate plasma etching device or magnetron parallel plate plasma etching device using magnetic fields in combination may also be used in addition to the high density plasma etching device.

Also in this case, after removing the native oxide film on the impurity diffusion layer, the surface of the impurity diffusion layer may be made amorphous and the transition metal layer may be formed successively. The transition metals referred to in the present invention mean a group of metal elements belonging to the well known periodical table and they also include high melting metals such as W or Mo.

The aspect of the present invention resides in removing the native oxide film on the impurity diffusion layer by using the plasma etching device of low ion energy and applying the salicide process by successively forming the transition metal layer without exposing the cleaned impurity diffusion layer to an atmospheric air.

For completely removing the firm native oxide film formed on the impurity diffusion layer by plasma etching at a low ion energy, a plasma etching device capable of obtaining plasmas at a density of not less than $1 \times 10^{11}/cm^3$ and not more than $1 \times 10^{14}/cm^3$ is adopted and, further, an etching condition of lowering a substrate bias (Vdc) is adopted in the present invention. Since the energy of the ions incident to the semiconductor substrate is also lowered in proportion with Vdc by the use of the low Vdc etching condition, the impurity diffusion layer does not suffer from damages such as crystal defects and surface roughening. In addition, by the use of the high density plasma device etching rate is not reduced even under the low Vdc condition. Since uniform plasma treatment is possible as a feature of the high density plasma device, uniform cleaning is possible for a large area semiconductor substrate.

Further, for completely removing the firm native oxide film formed on the impurity diffusion layer by plasma etching at the low ion energy, a plasma etching device capable of oblique ion incidence relative to the surface of the semiconductor is employed in the present invention. By the oblique ion incidence, the incident ion energy given on the surface of the semiconductor substrate is decreased to a value corresponding to the cosine for the angle of inclination. That is, assuming the incident angle of ions relative to the semiconductor substrate as 0° for perpendicular incidence and as 90° for parallel incidence, the ion energy upon incident angle inclined by an angle θ° is decreased to a value of an ion energy upon perpendicular incidence multiplied with cosθ. Accordingly, the impurity diffusion layer does not suffer from damages such as crystal defects or surface roughness.

As described above, since the native oxide film on the surface of the impurity diffusion layer is uniformly removed without causing damage or surface roughness to the surface and the transition metal layer is formed immediately thereafter, the siliciding reaction proceeds uniformly. As a result, the thus formed transition metal silicide layer causes no agglomeration, and has a smooth surface and satisfactory adhesion to provide a low sheet resistance value.

In any of the methods described above, if the outermost surface of the impurity diffusion layer is made amorphous, a solid phase reaction proceeds easily between the transition metal and silicon and uniform silicidation proceeds, which can further emphasize the effect of forming a transition metal silicide layer which is smooth and of excellent adhesion.

DESCRIPTION OF THE ACCOMPANY DRAWINGS

These and other objects, as well as advantageous features of the present invention will become apparent by reading the following descriptions for the preferred embodiments according to the present invention with reference to the accompanying drawings, wherein FIGS. 1A–1C are a schematic cross sectional view for explaining former-half of steps in the Examples 1, 2 and 3 according to the present invention in the order of the steps, in which

FIGS. 2A–2B are a schematic cross sectional view for explaining latter-half of the steps in Examples 1, 2 and 3 according to the present invention in the order of the steps, in which

FIGS. 3A–3B are a schematic cross sectional view for explaining Examples 4 and 5 according to the present invention in the order of the steps in which

FIGS. 7A–7C are a schematic cross sectional view illustrating the former-half of MOSIC production steps by using an existent salicide process in which

FIGS. 8A–8C are a schematic cross sectional view showing the latter-half of MOSIC production steps by using an existent salicide process in which

DESCRIPTION OF THE PREFERRED EMBODIMENTS

The present invention will be explained by way of concrete examples with reference to the accompanying drawings. Constituent portions corresponding to those in FIG. 7 and FIG. 8 referred to in the description of the prior art carry the same reference numerals.

EXAMPLE 1

This is an example of removing a native oxide film by soft etching the surface of an impurity diffusion layer by an ICP etching device and applying a salicide process, which is to be explained with reference to FIGS. 1A–C and FIGS. 2A–B.

At first, a MOS transistor is formed in accordance with a customary method. Since the process flow is identical with that in FIGS. 7A–B explained for the prior art, duplicate explanations will be omitted. Then, a native oxide film (not illustrated) on the surface of an impurity diffusion layer 6 is applied with soft etching under the following conditions as an example.

Figure 1A:
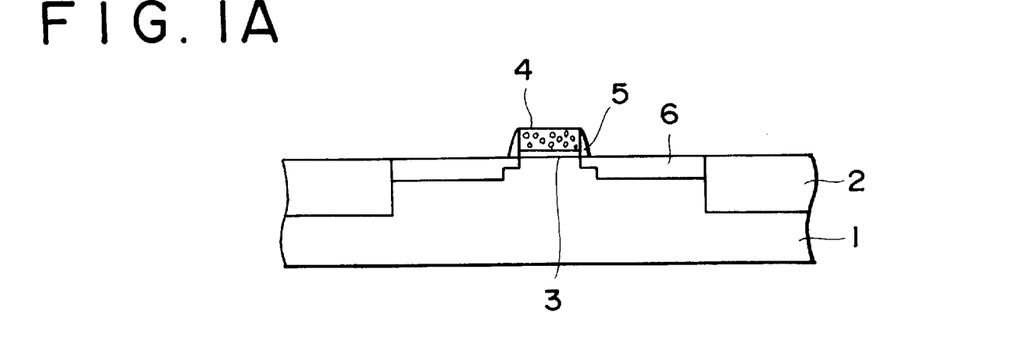
FIG. 1A shows a state of removing a native oxide film on the surface of an impurity diffusion layer in a MOS transistor.

Ar 10 sccm
Gas pressure 0.06 Pa
ICP power source power 1000 W
RF bias voltage 100 V
Substrate temperature normal temperature The native oxide film on the surface of the impurity diffusion layer 6 is removed without causing damages such as crystal defects or surface roughening to the surface. This state is shown in FIG. 1A.

Figure 1B:
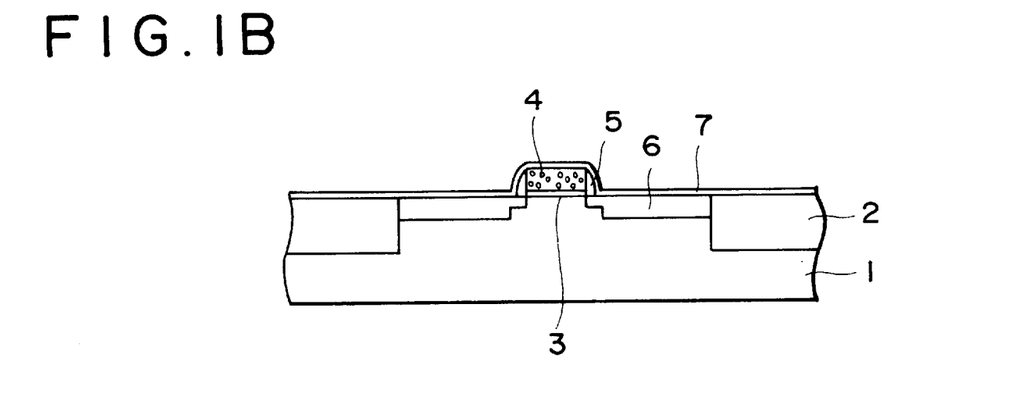
FIG. 1B shows a state of successively forming a transition metal layer over the entire surface.

Immediately after, as shown in FIG. 1B, a Ti transition metal layer 7 is formed by an RF sputtering device, for example, under the following conditions.

Ar 100 sccm
Gas pressure 0.47 Pa
RF power source power 1000 W
Substrate temperature 150° C.
Thickness of transition metal film 30 n It is desirable to connect the ICP etching device and the RF sputtering device or the like by way of a gate valve, so that the semiconductor substrate can be transported with no contact with an atmospheric air.

Figure 1C:
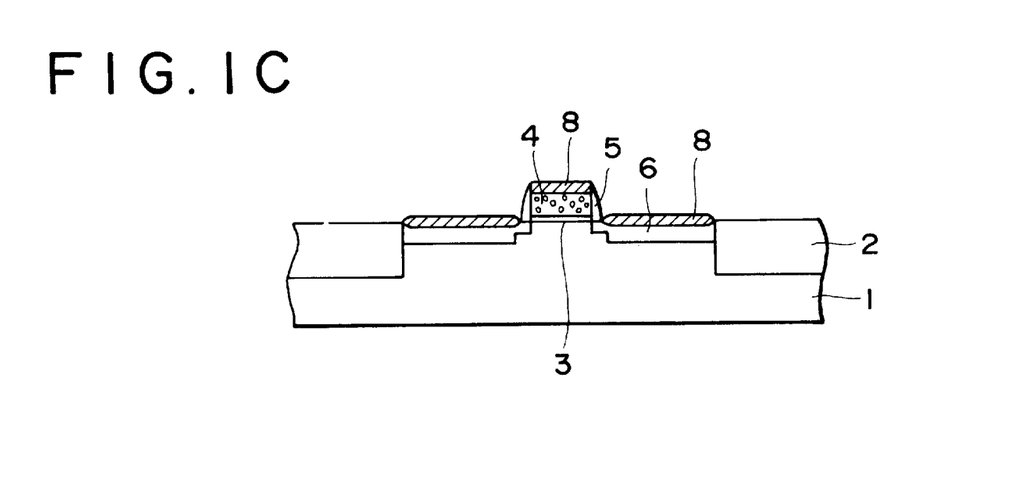
FIG. 1C shows a state of selectively forming the transition metal silicide layer on the impurity diffusion layer by a heat treatment.

Subsequently, the transition metal on the impurity diffusion layer 6 is selectively silicided by applying a first heat treatment at 600° C. Further, unreacted transition metal, for example, on a device isolation region 2 is removed by a wet process using aqueous ammonia-hydrogen peroxide. Then, a transition metal silicide layer 8 made of stable $TiSi_2$ is formed on the impurity diffusion layer 6 by a second heat treatment at 800° C. This state is shown in FIG. 1C. In the figure, the transition metal silicide layer 8 is formed also on the gate electrode 4.

The main portion of this example is as described above. Subsequently, an interlayer insulation film, a first metal wiring layer, etc. are formed in accordance with a customary method. An example of the process flow is shown below. Namely, an $SiO_2$ interlayer insulation film is at first formed under the following reduced pressure vacuum CVD condition.

Figure 2A:
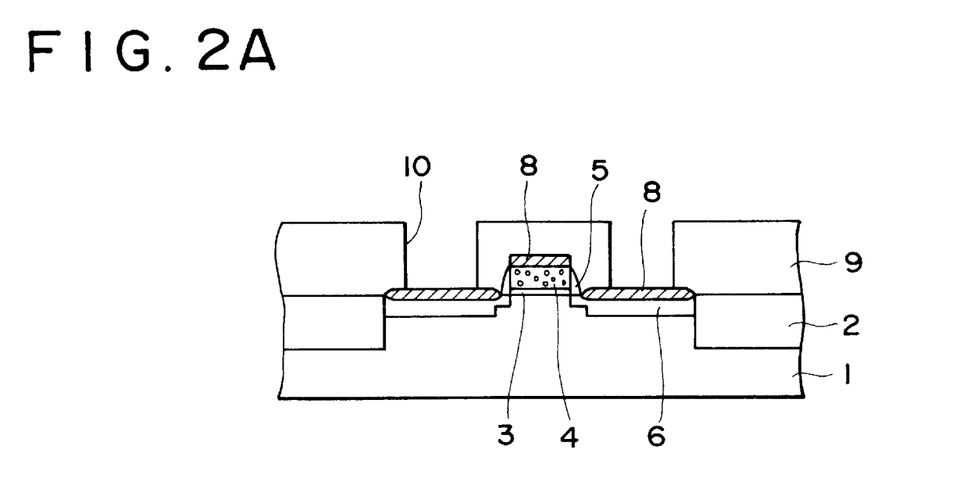
FIG. 2A shows a state of forming an interlayer insulation film and forming a connection hole facing a silicide layer on an impurity diffusion layer and FIG. 2B shows a state of forming a contact plug and a first metal wiring layer.

TEOS 50 sccm
$O_2$ 50 sccm
Gas pressure 40 Pa
Substrate temperature 150° C.
Thickness of interlayer insulation film 600 nm Then, a resist mask (not illustrated) having a opening facing the impurity diffusion layer is formed and then a connection hole 10 is opened by RIE under the following conditions. This state is shown in FIG. 2A.

$C_4F_8$ 50 sccm
Gas pressure 2 Pa
RF power source power 1200 W

Figure 2B:
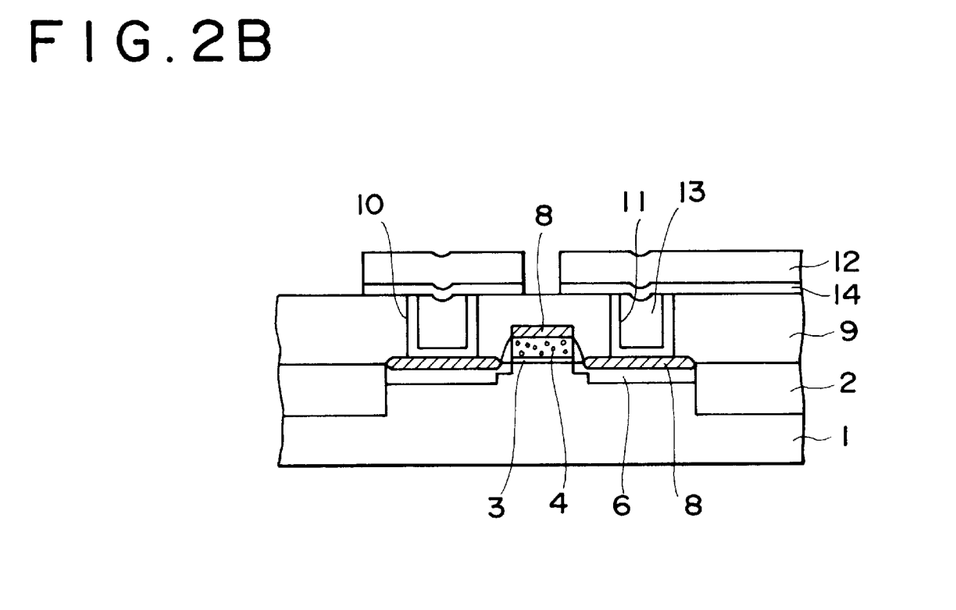

Then, for forming a W contact plug, an adhesion layer/barrier metal layer 11 of a Ti/TiN laminate structure is formed by sputtering and reactive sputtering. Ti layer forming condition:
Ar 100 sccm
Gas pressure 0.47 Pa
RF power source power 8 KW
Substrate temperature 150° C.
Film thickness 10 nm
TiN layer forming condition:

Ar 40 sccm
$N_2$ 20 sccm
Gas pressure
 0.47 Pa
RF power source power 5 KW
Substrate temperature 150° C.
Film thickness 70 nm Then, a W metal layer is formed under the following conditions by a blanket CVD.
$WF_6$ 75 sccm
$H_2$ 500 sccm
$N_2$ 300 sccm
Ar 2200 sccm
Gas pressure $1.1 \times 10^4$ Pa
Substrate temperature 450° C.
Film thickness 400 nm Subsequently, the adhesion layer/barrier metal layer 11 and the W metal layer are etched back under the following RIE conditions to form a W plug 13.
$SF_6$ 50 sccm
Gas pressure 1.33 Pa
RF power source power 150 W Then, a Ti/Al laminate re wirings is formed by sputtering.
Ti layer forming condition:
Ar 100 sccm
Gas pressure 0.47 Pa
RF power source power 4 KW
Substrate temperature 150° C.
Film thickness 30 nm
Al layer (Al-1% Si-0.5% Cu) forming condition:
Ar 50 sccm
Gas pressure 0.47 Pa
RF power source power 22,5 KW
Substrate temperature 150° C.
Film thickness 500 nm Subsequently, a desired resist mask (not illustrated) is formed and a first metal wirings comprising a Ti layer 14 and an Al layer 12 are formed under the following conditions.
$BCl_3$ 60 sccm
$Cl_2$ 90 sccm
Gas pressure 0.16 Pa
Microwave power source power 1 KW
RF power source power 50 W MOSIC is completed by the procedures described above. This state is shown in FIG. 2E.

In this example, since the ICP plasma etching device having a high density plasma generation source is used and the native oxide film on the impurity diffusion layer is removed by soft etching while setting the RF bias voltage lower, a transition metal silicide layer which is smooth, of low resistance and excellent adhesion can be formed.

EXAMPLE 2

This example is according to Example 1 except for the conditions for removing the native oxide film on the impurity diffusion layer. In this example, soft etching is applied by using a substrate bias application type helicon wave plasma etching device as the high density plasma etching device. Only one example for the etching conditions is shown below.
Ar 10 sccm
Gas pressure 0.06 Pa
Helicon wave power source power 1000 W
RF bias voltage 20 V
Substrate temperature normal temperature Also by the etching conditions in this example, the native oxide film on the surface of the impurity diffusion layer 6 is removed without resulting in damages such as crystal defects.

EXAMPLE 3

This example is also according to Example 1 except for the conditions for removing the native oxide film on the impurity diffusion layer. In this example, soft etching is applied by using a substrate bias application type ECR plasma etching device as the high density plasma etching device. Only one example for the etching conditions is shown below.

Ar 10 sccm
Gas pressure 0.06 Pa
ECR power source power 200 W
RF bias voltage 100 V
Substrate temperature normal temperature Also by the etching conditions in this example, the native oxide film on the surface of the impurity diffusion layer 6 is removed without resulting in damages such as crystal defects.

EXAMPLE 4

In this example, a native oxide film on an impurity diffusion layer is removed and then the cleaned surface of the impurity diffusion layer is formed into an amorphous state, a transition metal layer is formed successively and a salicide process is applied. This example is to be explained with reference to FIGS. 3A–D.

Figure 3A:
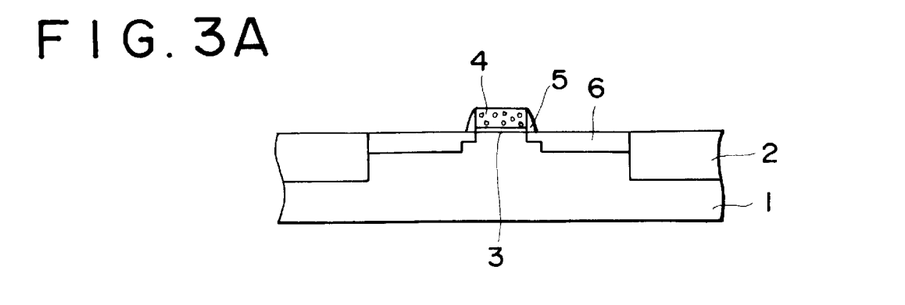
FIG. 3A shows a state of removing a native oxide film on the surface of an impurity diffusion layer of a MOS transistor.
Figure 3B:
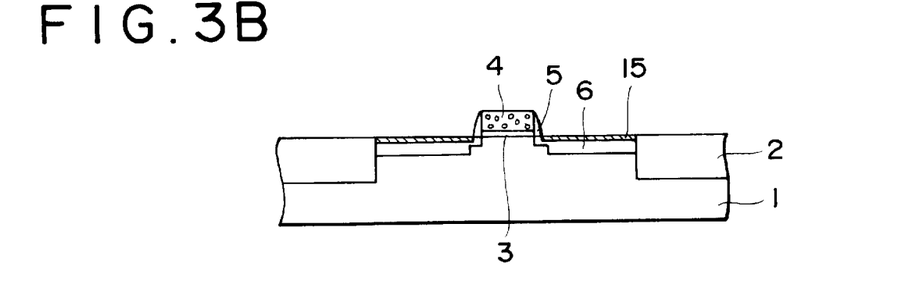
FIG. 3B shows a state of forming an amorphous layer on the surface of the impurity diffusion layer.

At first, as shown in FIG. 3A, a MOS transistor is formed and a native oxide film on the surface of an impurity diffusion layer is removed by an ICP etching device. Since the process flow up to this step is identical with that in the method explained referring to FIG. 1A in Example 1, duplicate explanation is to be omitted. Then, using the identical ICP etching device and under the following conditions in which both the ICP power source power and the Ar gas flow rate are increased, the surface of the impurity diffusion layer 6 is formed into an amorphous state. The surface of the impurity diffusion layer 6 is etched extremely thinly and at the same time an amorphous layer 15 is formed under the conditions. This state is shown in FIG. 3B.

Figure 3C:
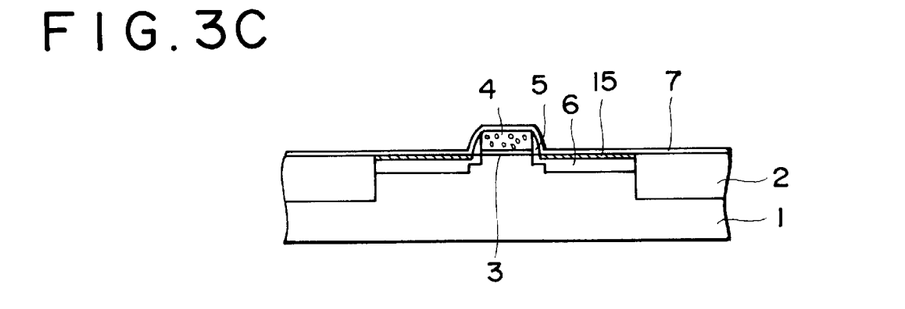
FIG. 3C shows a state of continuously forming a transition metal layer over the entire surface and FIG. 3D shows a state of selectively forming a transition metal silicide layer on the impurity diffusion layer by a heat treatment.
Figure 3D:
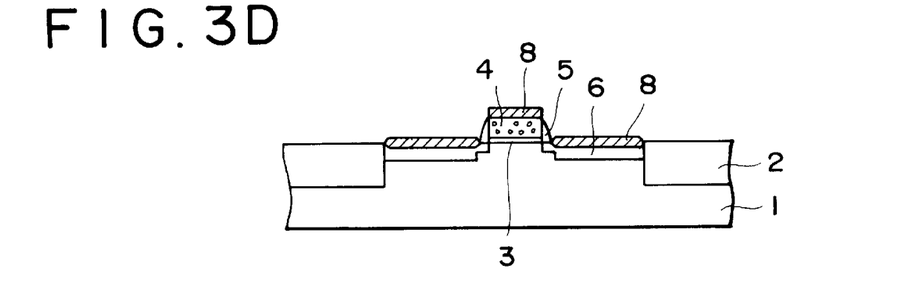

Ar 10 sccm
Gas pressure 0.12 Pa
ICP power source power 2000 W
RF bias voltage 100 V
Substrate temperature normal temperature The subsequent steps after the step shown in FIG. 3C for forming a transition metal layer 7 over the entire surface are the same as those in Example 1. In this example, since the surface of the impurity diffusion layer cleaned by the high density plasma etching is formed into an extremely thin amorphous state, the siliciding solid phase reaction between the impurity diffusion layer and the transition metal layer proceeds more easily, and a transition metal silicide layer 8 can be formed smoothly while keeping a uniform boundary as shown in FIG. 3D.

EXAMPLE 5

The basic process of this example is in accordance with the previous Example 4. After forming the transition metal silicide layer 8, that is, after the state shown in FIG. 3D, ion implantation is further applied to the impurity diffusion layer 6. As the ion implantation condition, As is applied for N-ch and $BF_2$ is applied for P-ch each at an acceleration voltage of 10 KeV and a dose of $1 \times 10^{15}/cm^2$, respectively. The subsequent process flow after forming the interlayer insulation film is identical with that in Example 1.

In this example, decrease of the thickness for the impurity diffusion layer caused by etching due to the amorphous process on the surface of the impurity diffusion layer can be compensated. This can lower the junction leakage.

EXAMPLE 6

The process as defined in claim 3 of the present invention is applied in this example and the subsequent examples and the native oxide film on the impurity diffusion layer is soft etched by a plasma etching device capable of oblique ion incidence relative to the semiconductor substrate. In this case, an angle formed between a plane perpendicular to the ion beam stream and a semiconductor substrate is defined as an incident angle θ of the ions as explained previously. That is, the incident angle of ions relative to the semiconductor substrate is defined as 0° for perpendicular an incidence and as 90° for parallel incidence.

In this example, the native oxide film is removed by soft etching the surface of the impurity diffusion layer by the ICP etching device and the salicide process is applied, which is in accordance with the procedures in Example 1.

Figure 4:
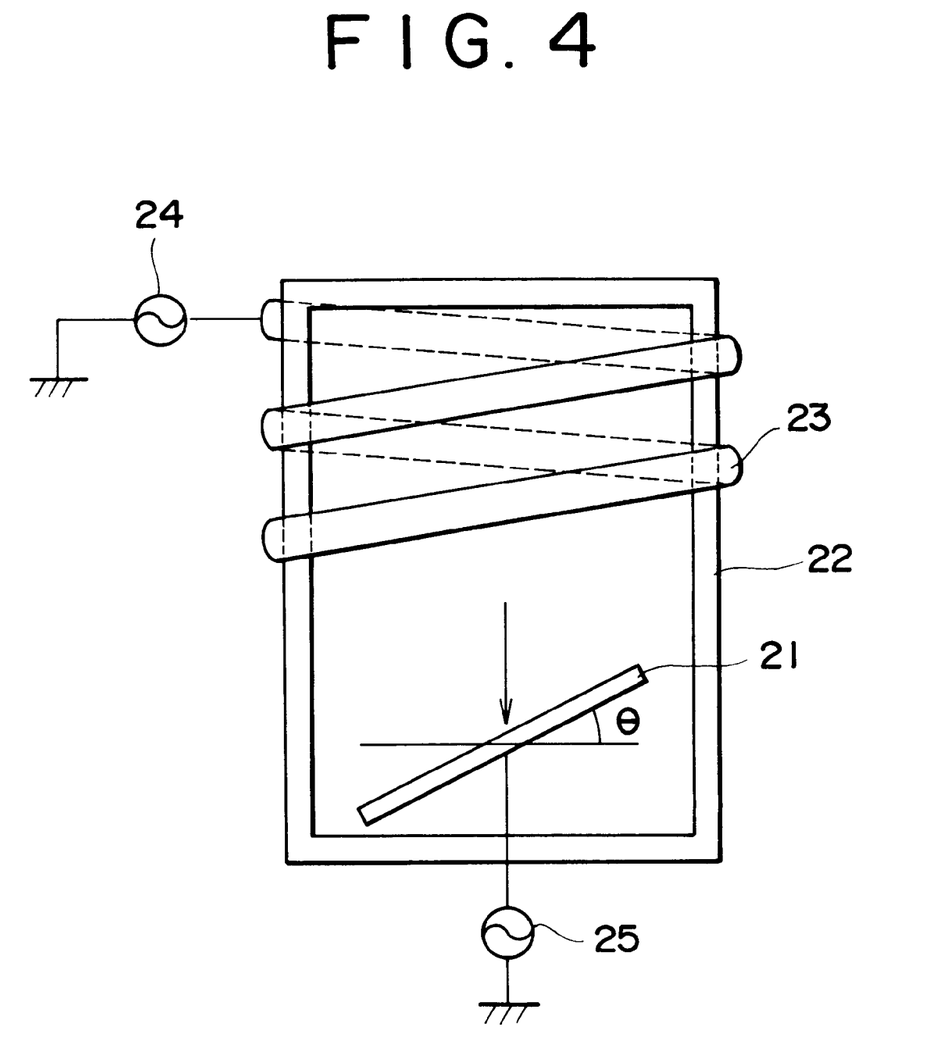
FIG. 4 is a schematic cross sectional view of a substrate bias application ICP etching device used for Examples 6 and 7 according to the present invention.

FIG. 4 is a schematic cross sectional view of an ICP etching device used in this example. At least a portion of a chamber 22 is made of a dielectric material such as $SiO_2$ and ICP coils 23 as large multi-turn coils are wound around the outer circumference of the chamber. Reference numeral 24 denotes an ICP power source, for example, working at 2 MHz, and a high density plasma generating source is constituted with the components described above. The feature of this etching device is that an angle for holding a semiconductor substrate disposed in a lower portion of the chamber 22 is made variable. Details for the impurity diffusion layer and the like formed to the semiconductor substrate 21 are not illustrated in FIG. 4, as well as in FIG. 5 and FIG. 6 which are schematic cross sectional views of etching devices to be explained later. The semiconductor substrate 21 is held on a substrate holding means not illustrated. The substrate holding means is made variable with respect to the angle relative to the ion stream from the high density plasma generation source, has an auto-rotation means for the semiconductor substrate 21 and further has a RF bias power source 25 connected therewith. In the figure, details for an etching gas introduction port means and a gas exhaust means are not illustrated. Further, it is desirable that the device has such a structure connected with a sputtering device for forming a transition metal layer by way of a gate valve or a transportation device not illustrated.

As described above, this example is in accordance with Example 1 only except for the conditions of removing the native oxide film on the impurity diffusion layer 6. The etching conditions are based on, for example, the following specification. The semiconductor substrate 21 is auto-rotated, for example, at 10 rpm, so that ion incident direction is entirely made uniform.

Ar 10 sccm
Gas pressure 0.06 Pa
ICP power source power 1000 W
RF bias voltage 100 V
Ion incident angle θ 60°
Substrate temperature normal temperature The native oxide film is soft etched under the etching conditions by the ion energy corresponding to an ion energy under the etching conditions in Example 1 multiplied with a factor of cosθ, namely, ion energy at a one-half level of that in Example 1. Since, the subsequent process after forming the transition metal layer is identical with that in Example 1, duplicate explanations are omitted.

According to this example, damages such as crystal defects to the impurity diffusion layer can be further reduced by the lowered ion energy due to the low substrate bias voltage and the ion energy further reduced by the combined use of the oblique ion incidence. Further, lowering of the through put due to the lowering of the etching rate does not occur by the adoption of the high density plasma etching device.

The native oxide film at the bottom of the connection hole with a high aspect ratio can be removed by this etching device by setting an ion incident angle θ to a smaller value. For instance, if the ion incident angle is set to 30°, at least a portion of the native oxide film at the bottom of the connection hole can be removed within a range of the aspect ratio up to 1.7 at the maximum.

EXAMPLE 7

This example is in accordance with Example 6 only except for using Ne instead of Ar for the process of removing the native oxide film on the impurity diffusion layer. That is, by using Ne with 20.0 atomic weight instead of Ar with 39.9 atomic weight as the etching gas, the incident ion energy can be reduced corresponding to the amount of decrease in the atomic weight. That is, a process of further less damage can be attained. As the etching gas, He (atomic weight: 4.0) may also be used.

EXAMPLE 8

Figure 5:
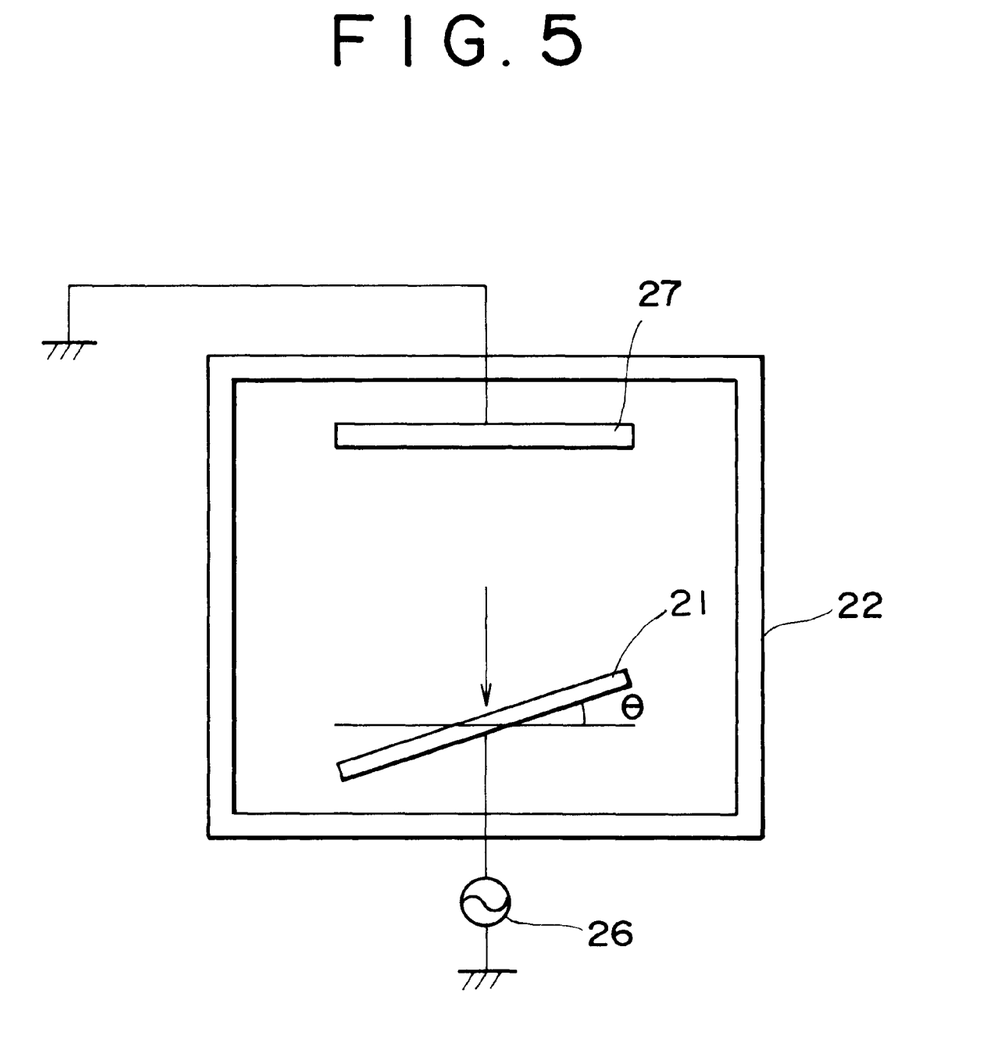
FIG. 5 is a schematic cross sectional view of a parallel plate RIE device used for Example 8 according to the present invention.

In this example, the native oxide film removing method by the oblique ion incidence described in Example 6 is applied to the parallel plate RIE device. FIG. 5 shows a schematic cross sectional view for the constitution of the device. In this figure, corresponding constituent portions to those in the ICP etching device in FIG. 4 referred to in Example 6 carry the same reference numerals. A counter electrode 27 at a ground potential is disposed to an upper portion and a semiconductor substrate 21 is disposed to a lower portion of the chamber 22. The semiconductor substrate is held on a not illustrated substrate holding means. The substrate holding means has a variable angle relative to the counter electrode 27, has an auto-rotation means for the semiconductor substrate 21 and also has an RF power source 26 connected therewith. In the figure, details for As etching gas introduction port means and a gas exhaustion means are not illustrated. Further, it is desirable that the device has such a constitution that the sputtering device for forming the transition metal layer is connected thereto by way of a gate valve or a transportation device not illustrated.

Soft etching for the native oxide film is possible also by the constitution of this etching device. When the surface of the counter electrode 27 is formed as a Ti target, while the RF power source 26 is connected with the counter electrode 27 and the semiconductor substrate is kept at a ground potential, the device can be constituted as a diode type RF sputtering device, so that the process from the soft etching to the formation of the transition metal layer by Ti sputtering can be applied successively within an identical device and re-oxidation or contamination of the cleaned impurity diffusion layer can be minimized.

EXAMPLE 9

Figure 6:
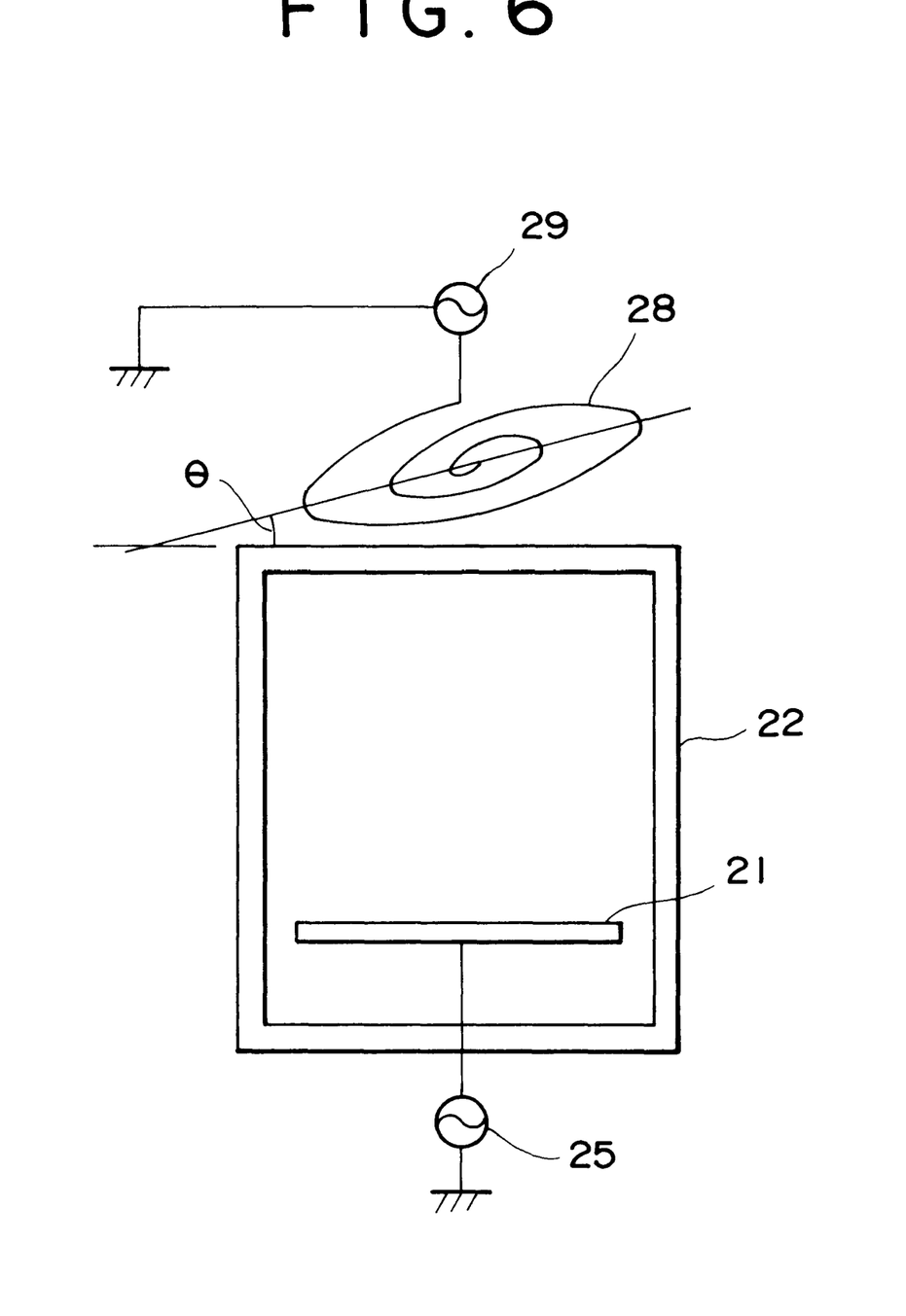
FIG. 6 is a schematic cross sectional view of a substrate bias application type TCP etching device used for Example 9 according to the present invention.

In this example, the native oxide film is removed by soft etching the surface of the impurity diffusion layer by a TCP etching device using TCP as a sort of inductively coupled plasmas as a plasma generation source and enabling oblique ion incidence by making the angle of the plasma generation source variable and the salicide process is applied.

FIG. 6 shows a schematic constitution of a TCP etching device adopted in this example. Also in this figure, constituent portions corresponding to those in the ICP etching device in FIG. 2 referred to in Example 6 carry the same reference numerals. At least an upper end portion of a chamber 22 is made of a dielectric material such as $SiO_2$ and flat spiral TCP coils 28 are disposed thereabove. Reference numeral 29 denotes a TCP power source working, for example, at 2 MHz and the portions described above substantially constitute the high density plasma generation source. A semiconductor substrate 21 is held on a substrate holding means not illustrated in a lower portion of the chamber, and an RF bias power source 25 is connected to the substrate holding means. The feature of this etching device is that the angle of the planar TCP coils 28 made variable. More exactly, the feature resides in that an angle made between the plane formed with the TCP coils 28 and the semiconductor substrate 21 is variable. In FIG. 6, an angle made between the plane at the upper end of the chamber 22 and a plane formed with the TCP coil 28 is represented as θ for the sake of convenience. With the view point of the uniformity for plasma etching, the device preferably comprises a constitution that one of TCP coils 28 or the semiconductor 21 is auto-rotatable. In the figure, details for an etching gas introduction means or a gas exhaustion means are not illustrated. Further, it is desirable that the device has such a constitution that the sputtering device for forming the transition metal layer is connected by way of a gate valve or a transportation device not illustrated.

This example is in accordance with Example 1 except only for the conditions for removing the native oxide film on the impurity diffusion layer 6 and the etching device. The etching conditions are, for example, based on the following specification. The semiconductor substrate 21 is auto-rotated, for example, at 10 rpm so that the ion incident direction is made entirely uniform.

Ar 10 sccm
Gas pressure 0.06 Pa
TCP power source power 1000 W
RF bias voltage 100 V
Ion incident angle θ 30°
Substrate temperature normal temperature The native oxide film is soft etched under the etching conditions by an ion energy corresponding to the ion energy under the etching conditions in Example 1 multiplied with a factor of cosθ, namely, an ion energy at a level by about 0.86 times the level in Example 1. Since, the succeeding process after forming the transition metal layer is identical with that in Example 1, duplicate explanations are omitted.

According to this example, damages such as crystal defects to the impurity diffusion layer can be reduced further effectively by the lowered ion energy due to the low substrate bias voltage, and by the ion energy further reduced by the combined use of the oblique ion incidence. Further, lowering of the through put caused by the lowering of the etching rate does not occur by the adoption of the high density plasma etching device. Example 6 to Example 9 are examples for forming the transition metal layer immediately after removing the native oxide film on the impurity region layer. Alternatively, the transition metal layer may be formed after the amorphous treatment to the cleaned surface of the impurity diffusion layer as shown in Example 4. The effect obtained by forming the amorphous state is the same as in Example 4.

While the present invention has been explained by way of nine examples but the present invention is not restricted only to such examples.

For instance, although Ti is mentioned as the transition metal, various kinds of other transition metals such as Co, Ni, W, Mo, Pt, Zr and Hf may also be used in the same manner. For the film-forming method, CVD, vapor deposition or the like may be employed in addition to sputtering. However, it is necessary to take a consideration in view of process not to recontaminate the cleaned surface of the impurity diffusion layer.

As the semiconductor device to which the salicide process is applied, the process is also applicable to various kinds of silicon devices such as bipolar IC, BiMOS-IC and CCD device, in addition to MOSIC. Further, the etching device or the process conditions can be changed properly within a scope of the technical idea of the present invention.

As apparent from the foregoing explanations, according to the method of manufacturing the semiconductor device of the present invention, the native oxide film on the surface of the impurity diffusion layer or the like can be removed uniformly and safely, as well as the impurity diffusion layer does not suffer from damages such as crystals defects or surface roughening.

By applying the salicide process to the thus cleaned surface of the impurity diffusion layer, the thus formed transition metal silicide layer is free from agglomeration of crystal grains, has excellent adhesion with the underlying layer and has a smooth surface of low resistance characteristic. Accordingly, the present invention contributes to the improvement of various characteristics such as high speed operation, low voltage operation and less electric power consumption of a semiconductor device such as MOSIC which is highly integrated and based on refined design rules.

What is claimed is:

1. A method for making a semiconductor device comprising the steps of:

preparing a semiconductor substrate including a surface with an exposed impurity diffusion layer;

removing a native oxide film from the exposed impurity diffusion layer by plasma etching in a plasma etching device employing a high density plasma of not less than $1 \times 10^{11}/cm^3$ and not more than $1 \times 10^{14}/cm^3$ at an RF bias voltage of about 20 v or about 100 v wherein the incident angle of ions relative to the surface is between 0° and 90° and while providing relative rotation between the high density plasma and the substrate to provide a native oxide free surface portion; and thereafter, depositing a transition metal layer and forming a transition metal silicide layer on said oxide free surface portion without exposing the substrate to atmospheric air.

2. A method as defined in claim 1, wherein in said removing step, the high density plasma is an inductively coupled plasma.

3. A method as defined in claim 1, wherein in said removing step, the high density plasma is a helicon wave plasma.

4. A method as defined in claim 1, wherein in said removing step, the high density plasma is an ECR plasma.

5. A method as defined in claim 1, wherein the high density plasma is selected from the group consisting of argon, neon and helium.

6. A method as defined in claim 5, wherein the incident angle is 60°.

7. A method as defined in claim 1, wherein the incident angle is 30°.

8. A method as defined in claim 1, wherein in the depositing step, the transition metal is selected from the group consisting of: Ti, Co, Ni, W, Mo, Pt, Zr and Hf.

* * * * *